(12) United States Patent
Fackler et al.

(10) Patent No.: US 6,259,603 B1
(45) Date of Patent: Jul. 10, 2001

(54) ELECTRONIC CONTROL UNIT

(75) Inventors: Rupert Fackler, Pleidelsheim; Thomas Laux, Markgroeningen, both of (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 09/183,223

(22) Filed: Oct. 30, 1998

(30) Foreign Application Priority Data

Nov. 13, 1997 (DE) .............................. 197 50 306

(51) Int. Cl.$^7$ ................................. H05K 7/20
(52) U.S. Cl. ............ 361/707; 361/704; 361/709; 361/712; 361/736; 361/737; 174/16.3
(58) Field of Search ................... 361/704, 707, 361/715, 719, 720, 721, 730, 752, 737, 736; 174/16.3, 80.2, 80.9, 185; 257/706, 707, 711

(56) References Cited

U.S. PATENT DOCUMENTS

| | | | |
|---|---|---|---|
| 5,012,386 | * 4/1991 | McShane et al. | 361/715 |
| 5,159,532 | * 10/1992 | Kilian et al. | 361/717 |
| 5,235,347 | * 8/1993 | Lee | 364/107 R |
| 5,287,247 | * 2/1994 | Smits et al. | 361/707 |
| 5,293,301 | * 3/1994 | Tanaka et al. | 361/707 |
| 5,343,360 | * 8/1994 | Sanwo | 361/707 |
| 5,398,160 | * 3/1995 | Umeda | 361/707 |
| 5,523,919 | * 6/1996 | Canova | 361/720 |
| 5,642,261 | * 6/1997 | Bond et al. | 361/704 |
| 5,912,375 | * 9/1998 | Casperson | 361/707 |
| 5,991,156 | * 11/1999 | Bond et al. | 361/707 |

FOREIGN PATENT DOCUMENTS 196 27 663    1/1997   (DE).

* cited by examiner

Primary Examiner—Jaffrey Gaffin
Assistant Examiner—Tuan Dinh
(74) Attorney, Agent, or Firm—Kenyon & Kenyon

(57) ABSTRACT

An electronic control unit, in particular for motor vehicles, having at least one electronic circuit arranged on at least one p.c. board and at least one additional circuit designed as a hybrid circuit which is attached to the at least one circuit arranged on the at least one p.c. board with an electrically conductive connection. A heat-conducting carrier element, which has mounting surfaces for attaching the at least one p.c. board and the at least one hybrid, is provided.

6 Claims, 1 Drawing Sheet

ELECTRONIC CONTROL UNIT

FIELD OF THE INVENTION

The present invention relates to an electronic control unit, in particular for motor vehicles, having at least one electronic circuit arranged on at least one p.c. board and at least one additional electronic circuit designed as a hybrid circuit which is connected to the at least one circuit arranged on the at least one p.c. board with an electrically conductive connection.

BACKGROUND INFORMATION

Electronic control units are used in a wide variety of technical fields. One important application is the field of automotive engineering. Since electronic control units in motor vehicles are exposed to harsh environmental conditions, such as high temperatures, strong vibrations, etc., and because motor vehicles usually offer very little room for installing electronic control units, arranging individual circuit components on essentially known p.c. boards, while designing other circuit components as hybrids has been known for some time. These types of hybrids are arranged on the p.c. board and attached to the circuit components of the p.c. board with electrically conductive connections.

German Published Patent Application No. 196 27 663, for example, describes an electronic circuit which is composed of a main board and secondary boards that have different coefficients of thermal expansion and are attached to one another.

These types of electronic circuits and control units have a great advantage in that circuit components which are very sensitive to environmental influences, for example temperature- and vibration-sensitive circuit components such as microcontrollers, processors and the like, can be designed as hybrid circuits, while circuit components that are less sensitive to environmental influences can be implemented as p.c. board circuits in the known manner. Combining the hybrid and p.c. board technologies offers the further advantage that circuit components which can be used simultaneously in several different electronic control units and circuits can be designed as hybrid circuits, with individual circuit components being implemented as p.c. board circuits. This makes it possible to produce a great variety of circuits which meet strict environmental requirements while simultaneously keeping production costs low.

However, heat dissipation from hybrids mounted on p.c. boards frequently presents a problem.

SUMMARY OF THE INVENTION

An object of the present invention is to provide an electronic control unit that includes electronic circuits designed, in particular, as hybrid circuits that are assembled in a simple manner. The present invention provides effective heat dissipation of both the hybrid circuit and the rest of the circuit arranged on the p.c. board.

In order to achieve this object, the electronic control unit of the present invention is provided with a heat-conducting carrier element which has mounting surfaces for attaching the at least one p.c. board and the at least one hybrid.

The mounting surfaces provided on the heat-conducting carrier element not only make it possible to attach the p.c. board and the hybrid precisely and in a manner which is particularly easy to implement from a technical standpoint, but also provide especially effective dissipation of the waste heat from the circuit components on the p.c. board and those designed as hybrids.

In particular, in order to optimally position the hybrid on the p.c. board and to optimally dissipate the waste heat generated by the hybrid, one advantageous embodiment calls for arranging the mounting surface for the hybrid on a base that is essentially as high as the p.c. board is thick.

The hybrid is thus arranged directly above the p.c. board (s), thereby providing optimum (and especially simple) contacting of the electrical hybrid connections with the electrical connections of the p.c. board(s).

In principle, both the p.c. board and the hybrid can be attached to the carrier element in a variety of ways. One embodiment that is especially advantageous in terms of heat conduction calls for attaching the at least one p.c. board and the at least one hybrid to the carrier element over their entire surfaces, in particular with an adhesive bond, which provides direct contact between the p.c. board(s) and the hybrid(s).

The electrical connection between the at least one p.c. board and the at least one hybrid can also be implemented in a variety of ways. Providing a connection produced by reflow soldering as the electrical connection between the at least one p.c. board and the at least one hybrid has proven to be an especially advantageous method. This makes it possible, in particular, to avoid plated-through holes in the p.c. board. In addition, this type of contacting and connection technique makes it possible to mount components automatically.

The carrier element itself can be made of a wide variety of heat-conducting materials. The carrier element is advantageously made of a metal, preferably aluminum. The special advantage of aluminum is its low tare weight, which is of decisive importance for automotive engineering applications.

DETAILED DESCRIPTION

Figure 1:
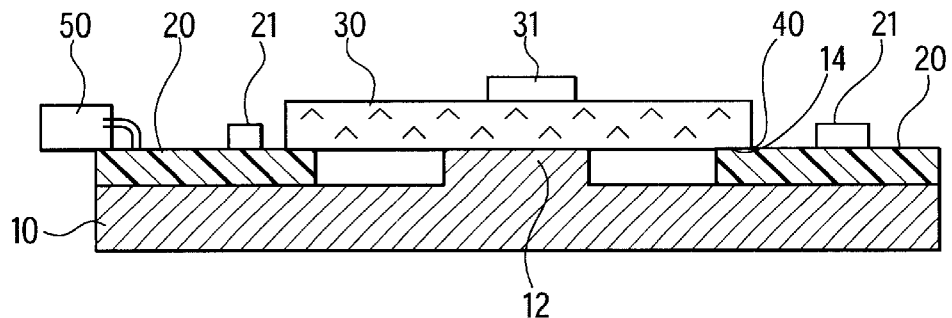
FIG. 1 shows a schematic cross-component of an electronic control unit according to the present invention.
Figure 2:
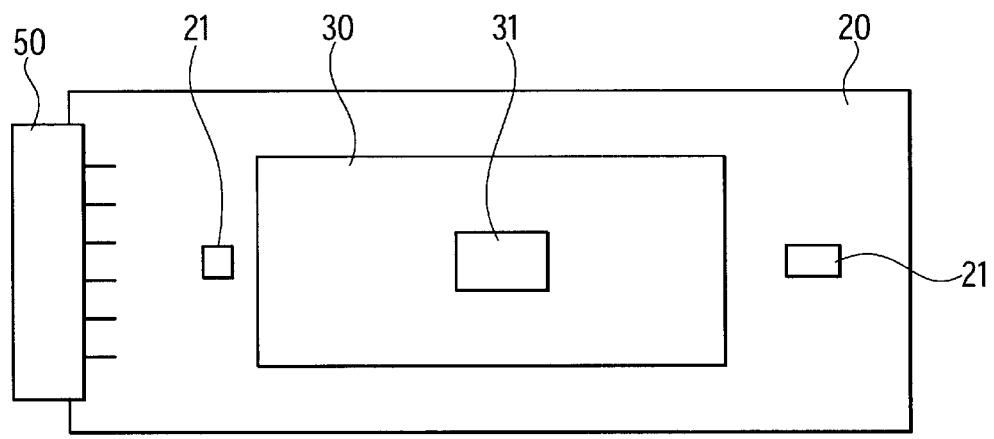
FIG. 2 shows a top view of the electronic control unit according to the present invention illustrated in FIG. 1.

An electronic control unit, used for example in automotive engineering and illustrated in FIG. 1 and FIG. 2, has a carrier element 10 in the form of an aluminum carrier to which a p.c. board 20 with a first circuit component 21 and a hybrid 30 with a second circuit component 31 are attached. In the area of the hybrid 30, carrier element 10 has a base 12 which is as high as p.c. board 20 is thick, so that hybrid 30 is positioned directly above p.c. board 20, thus making it possible, in particular, to establish electrical contact between the electrical contact elements of hybrid 30 and those of p.c. board 20.

The electrical connection between the electrical contact elements of hybrid 30 and the contact elements of p.c. board 20 is established by reflow soldering. For this purpose, contact areas 14, known as lands, are arranged on p.c. board 20 and, just like the contact elements on hybrid 30, are covered with tin-lead solder 40.

In addition to its finction described above for positioning hybrid 30 above p.c. board 20, base 12 provided on carrier element 10 is also used to optimally dissipate the heat loss generated by hybrid 30. The heat loss generated by the circuit arranged on p.c. board 20 is, of course, also optimally dissipated by carrier element made of aluminum.

Both p.c. board 20 and hybrid 30 can be attached to carrier element 10 by adhesive bonds or other suitable connections, thus providing optimum heat dissipation by ensuring that their entire surfaces rest against the corresponding mounting surfaces of carrier element 10.

As shown in FIG. 1 and FIG. 2, one or more connectors 50 are provided on p.c. board 20 in order to connect the electronic control unit to other circuit components not provided on p.c. board 20 or carrier 10.

What is claimed is:

1. An electronic control unit for a motor vehicle, comprising:
   at least one p.c. board;
   at least one electronic circuit arranged on the at least one p.c. board;
   at least one additional electronic circuit electroconductively coupled to the at least one electronic circuit via the at least one p.c. board, the at least one additional circuit including at least one hybrid circuit, the at least one hybrid circuit being arranged over the at least one p.c. board, the at least one hybrid circuit having contact surfaces on a side of the at least one hybrid circuit facing the at least one p.c. board, the contact surfaces being electroconductively coupled to a side of the at least one p.c. board facing the hybrid circuit; and
   a heat-conducting carrier element having mounting surfaces for attachment with the at least one p.c. board and with the at least one hybrid circuit.

2. The electronic control unit according to claim 1, wherein:
   the carrier element includes at least one raised base portion having a height corresponding to a thickness of the at least one p.c. board the at least one raised base portion being raised relative to at least another portion of the carrier element; and
   the mounting surfaces located in an area of the at least one hybrid circuit are arranged on the at least one raised base portion.

3. The electronic control unit according to claim 1, wherein each one of an entire surface of the at least one p.c. board and an entire surface of the at least one hybrid circuit is coupled to the heat-conducting carrier element by an adhesive bond.

4. The electronic control unit according to claim 1, wherein the at least one p.c. board is coupled to the at least one hybrid circuit by an electrical connection produced by a reflow soldering operation.

5. The electronic control unit according to claim 1, wherein the heat-conducting carrier element is composed of a metal.

6. The electronic control unit according to claim 5, wherein the metal includes aluminum.

\* \* \* \* \*